(12) United States Patent
Balasubramaniam et al.

(10) Patent No.: US 6,200,887 B1
(45) Date of Patent: Mar. 13, 2001

(54) METHOD TO FORM A SMOOTH GATE POLYSILICON SIDEWALL IN THE FABRICATION OF INTEGRATED CIRCUITS

(75) Inventors: Palanivel Balasubramaniam; Narayanan Balasubramanian; Yelehanka Ramachandramurthy Pradeep; Arjun Kantimahanti, all of Singapore (SG)

(73) Assignee: Chartered Semiconductor Manufacturing Ltd, Singapore (SG)

( * ) Notice: Subject to any disclaimer, the term of this patent is extended or adjusted under 35 U.S.C. 154(b) by 0 days.

(21) Appl. No.: 09/490,133

(22) Filed: Jan. 24, 2000

(51) Int. Cl.$^7$ ................................................ H01L 21/4763
(52) U.S. Cl. ........................ 438/585; 438/299; 438/515; 438/516; 438/528; 438/529; 438/532
(58) Field of Search ...................... 438/197, 299, 438/301, 516, 515, 527, 528, 529, 532, 585

(56) References Cited

U.S. PATENT DOCUMENTS

| | | | |
|---|---|---|---|
| 5,236,856 | * | 8/1993 | Chan et al. . |
| 5,273,924 | * | 12/1993 | Chan et al. . |
| 5,393,682 | | 2/1995 | Liu ........................................... 437/41 |
| 5,548,132 | | 8/1996 | Batra et al. ............................. 257/66 |
| 5,652,156 | | 7/1997 | Liao et al. ............................. 437/40 |
| 5,731,239 | | 3/1998 | Wong et al. ......................... 438/296 |
| 5,879,975 | * | 3/1999 | Karlsson et al. ..................... 438/162 |

* cited by examiner

*Primary Examiner*—Long Pham
(74) *Attorney, Agent, or Firm*—George O. Saile; Rosemary L. S. Pike

(57) ABSTRACT

A method for forming gate structures with smooth sidewalls by amorphizing the polysilicon along the gate boundaries is described. This method results in minimal gate depletion effects and improved critical dimension control in the gates of smaller devices. The method involves providing a gate silicon oxide layer on the surface of the semiconductor substrate. A gate electrode layer, such as polysilicon is deposited over the gate silicon oxide followed by a masking oxide layer deposited over the gate electrode layer. The masking oxide layer is patterned for the formation of the gate electrode. An ion implantation of silicon or germanium amorphizes the area of the polysilicon not protected by the masking oxide mask and also amorphizes the area along the boundaries of the polysilicon gate. Thereafter, the amorphized silicon is then removed by an anisotropic etch leaving a narrow area of amorphized silicon on the gate electrode sidewalls under the edges of the masking oxide mask completing the gate structure having smooth sidewalls.

23 Claims, 2 Drawing Sheets

METHOD TO FORM A SMOOTH GATE POLYSILICON SIDEWALL IN THE FABRICATION OF INTEGRATED CIRCUITS

BACKGROUND OF THE INVENTION (1) Field of the Invention

The present invention relates to the fabrication of integrated circuit devices, and more particularly, to a method of forming a smooth gate polysilicon sidewall in the fabrication of integrated circuits.

(2) Description of the Prior Art

In the fabrication of integrated circuits, photolithography and etching are used to form structures such as polysilicon gates, local oxidation of silicon (LOCOS), shallow trench isolation (STI), and the like. The photoresist material is coated over the layer or layers to be etched. The photoresist is exposed to actinic light through a mask, then developed to form the photoresist mask for etching the underlying layer or layers.

Polysilicon is used as the gate electrode of MOS transistors. The gate electrode is fabricated by reactive ion etching of the polysilicon with the pattern defined by the photoresist mask. Using the current art, the sidewall of the polysilicon after etching is rough. The roughness is determined by the grain size of the polysilicon crystals at the time of etching. For ultrasmall geometry devices the grain size becomes comparable to the device line widths. This may lead to poor polysilicon critical dimension (CD) distribution after etch which in turn affects the control of parameters such as threshold voltage ($V_t$) and drain saturation current ($I_{dsat}$). Use of amorphous silicon for the gate material instead of polysilicon results in smoother sidewalls due to the absence of grains. This solution, however, results in an increase in undesirable polysilicon depletion effects causing higher gate oxide capacitance and higher threshold voltage.

U.S. Pat. No. 5,393,682 to Liu teaches a method of damaging a polysilicon layer, then using an anisotropic etch to more quickly remove the damaged layer. The result is a tapered, trapezoidal shaped gate structure rather than a rectangular gate. U.S. Pat. No. 5,731,239 to Wong et al teaches a method using a pre-amorphizing implantation resulting in smaller grain sizes. U.S. Pat. No. 5,548,132 to Batra et al teaches a method using an amorphizing silicon implant affecting grain sizes in polysilicon. U.S. Pat. No. 5,652,156 to Laio et al teaches a method of forming the gate using multiple layers of polysilicon and amorphized silicon.

SUMMARY OF INVENTION

Accordingly, it is the primary object of the invention to provide an effective and very manufacturable process for forming gate structures with minimal gate depletion effects.

It is a further object of the invention to form gate structures with smooth sidewalls.

It is a further object of the invention to form structures having feature sizes on the order of between 0.5 to 0.006 microns.

Another object of the invention is to improve critical dimension control in the gates of smaller devices.

Yet another object is to provide a method of amorphizing the gate structure sidewalls.

In accordance with the objects of the invention, a new method for forming a gate electrode with a smooth sidewall is achieved. A gate silicon oxide layer is provided on the surface of the semiconductor substrate. A gate electrode layer, such as polysilicon or polysilicon germanium of thickness from 800 to 5000 Angstroms is deposited overlying the gate silicon oxide layer. A masking oxide layer is deposited overlying the gate electrode layer. The masking layer is covered with a layer of photoresist. The photoresist is patterned using a photolithography process to provide a photoresist mask for the formation of the gate electrode. The photoresist mask and the masking oxide layer are etched vertically forming a mask for the gate electrode. An ion implantation of silicon or germanium amorphizes the area of the polysilicon not covered by the masking oxide mask and, because of lateral scattering of the implant, also amorphizes a portion of the polysilicon area under the edge of the masking oxide layer. Thereafter, the amorphized silicon is removed by a conventional anisotropic dry etch leaving a narrow area of amorphized silicon on the gate electrode sidewalls under the edges of the masking oxide mask in the manufacture of an integrated circuit.

BRIEF DESCRIPTION OF DRAWINGS

In the accompanying drawings forming a material part of this description, there is shown.

DESCRIPTION OF THE PREFERRED EMBODIMENTS

The process of the present invention can be used in any application where minimal depletion effects, smooth gate sidewalls and small feature sizes are desired. The process can be used to form bit lines, word lines, polysilicon gate electrodes, and the like. The drawings FIGS. 1 through 5 illustrate the process of the invention in making a gate electrode with a smooth sidewall. It will be appreciated by those skilled in the art that the process can be used in any application where lithography and etching are used to form the structure and where small feature sizes are needed.

Figure 1:
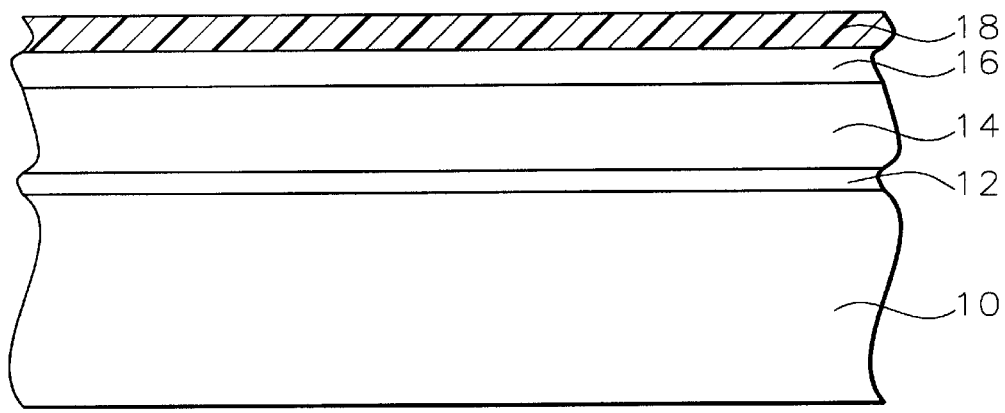
FIGS. 1 through 5 are cross sectional representations of a preferred embodiment of the present invention.

Referring now more particularly to FIG. 1, there is shown a semiconductor substrate 10. A gate silicon oxide layer 12 is grown on the surface of the substrate and may be composed of silicon oxide with a thickness of between about 10 to 150 Angstroms. The gate silicon oxide layer 12 may be grown by dry or partial wet oxidation with a $NH_4/N_2O$ anneal at a temperature of between about 700 to 900° C. or deposited or grown by RTO at a temperature of between about 400 to 1000° C. The gate electrode layer 14 deposited at a thickness of between about 200 to 5000 Angstroms, may be composed of polysilicon or polysilicon germanium.

A masking layer of silicon oxide 16 is deposited overlying the polysilicon or polysilicon germanium layer to a thickness of between 500 and 3000 Angstroms.

Figure 2:
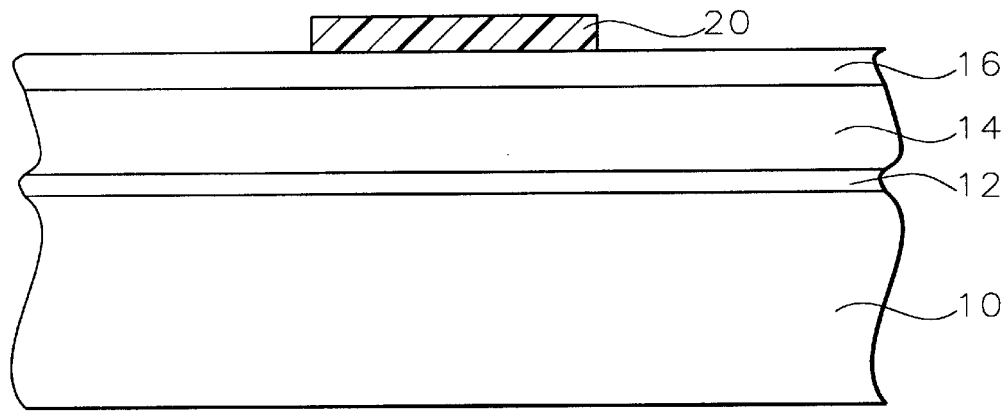

A layer of photoresist 18 is coated over the oxide layer 16. The photomask, not shown, is positioned over the wafer and the photoresist material is exposed using actinic light using I-line photolithography, for example. The photoresist is developed to leave a photoresist mask 20, as shown in FIG. 2.

Figure 3:
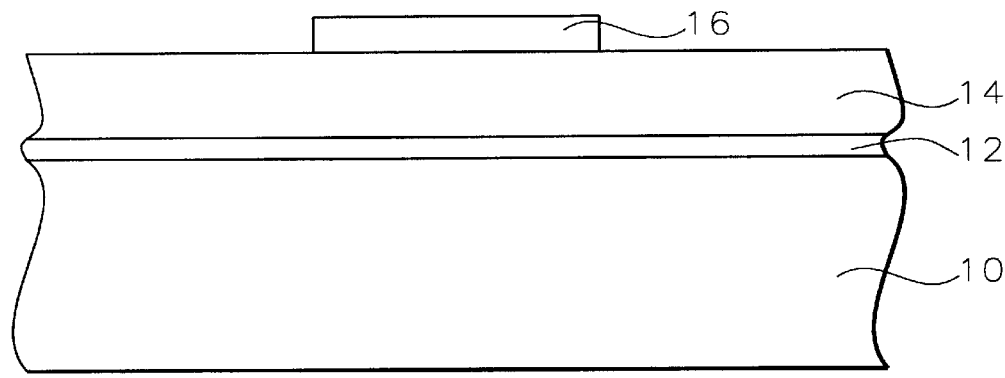

Referring now to FIG. 3, portions of the masking layer unprotected by the photoresist mask are etched away and the photoresist mask is removed by conventional means.

Figure 4:
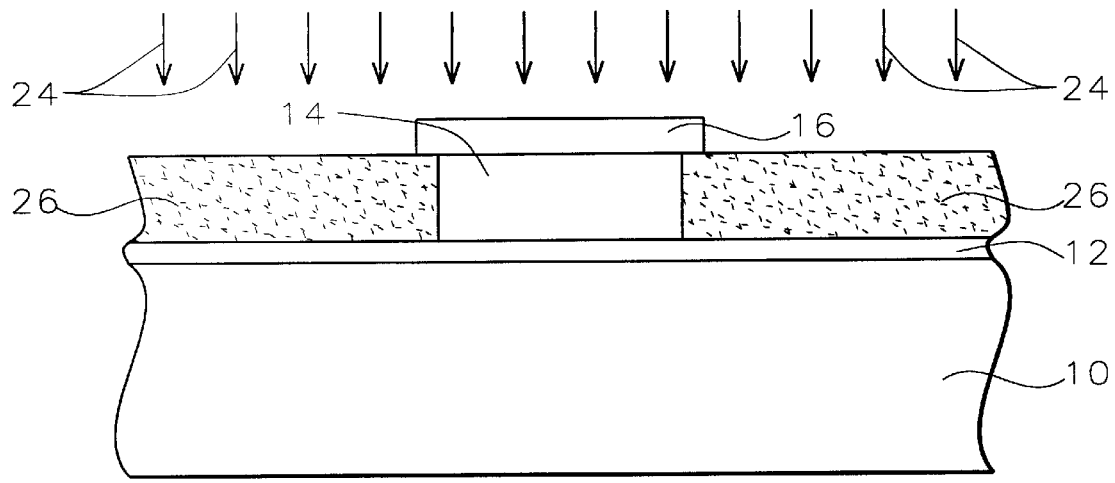

Referring now to FIG. 4, ions 24 are implanted into the polysilicon layer 14 where it is not covered by the masking layer 16. The ions to be implanted may include silicon, germanium, arsenic, phosphorous, boron, or $BF_2$. This results in an area of amorphized polysilicon 26. For example, on a polysilicon layer 14 of thickness 2000 Angstroms, a first silicon implant of energy 30 to 50 keV with dosage of 8E14 to 5E15 atoms/$cm^2$ would be performed. This would be followed by a second silicon implant from 60 to 80 keV with a dosage of 8E14 to 5E15 atoms/$cm^2$. A third silicon implant would then be performed at 90 to 120 keV with a dosage of 8E14 to 5E15 atoms/$cm^2$. If germanium ions were implanted, the implant dosage for all implantations would be from 5E14 to 5E15 atoms/$cm^2$ and would have energy level ranges of between about 50 to 80 keV, 100 to 170 keV, and 100 to 270 keV for the first, second and third implants respectively. The above examples are illustrative only, and the order of implant energies is not critical. The energy levels for the series of implantations are adjusted so that the projected depths cover the entire thickness of the polysilicon layer. Preferably, at least two energy profiles should be used. This process amorphizes the entire sidewall of the gate through lateral scattering for a short distance into the polysilicon 14 under the edges of the masking layer 16. This will form smooth sidewalls on the completed gate while avoiding the undesirable depletion effects.

Figure 5:
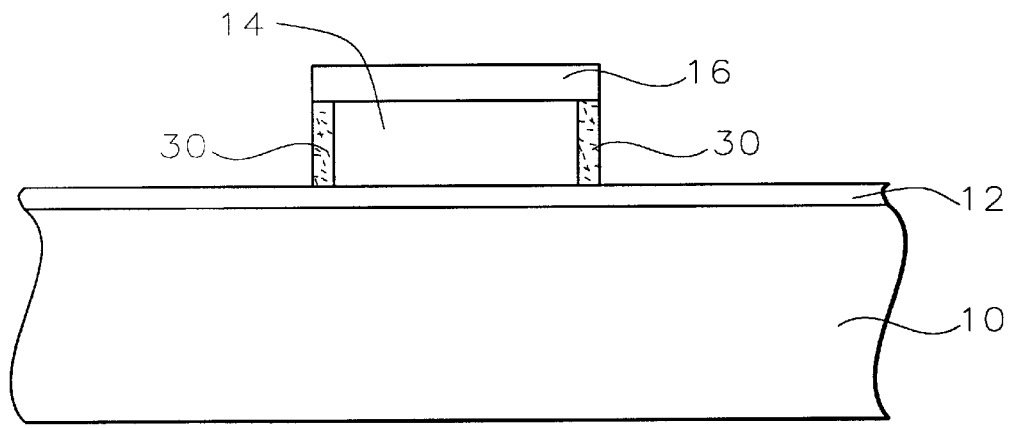

Referring now to FIG. 5, the amorphized polysilicon area 26 not covered by the masking layer 16 is removed by an anisotropic dry etch leaving a small area of amorphized polysilicon 30 along the edges of the gate. This etch is performed with an endpoint detection followed by an overetch of between about 10 to 150%. The masking layer 16 is removed by conventional means.

Figure 6:
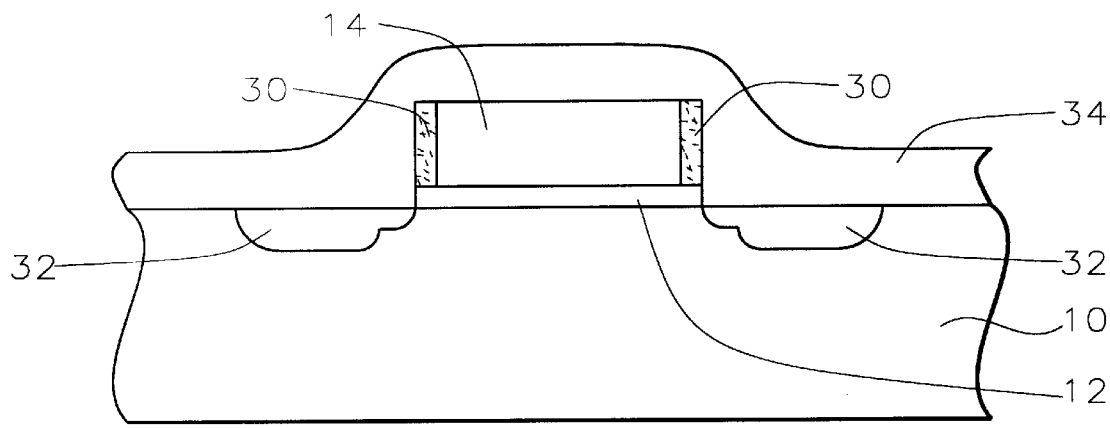
FIG. 6 is a cross-sectional representation of a completed integrated circuit device fabricated by the process of the invention.

Referring now to FIG. 6, processing continues as is conventional in the art. If as illustrated in the drawing figures, gate electrodes have been fabricated by the process of the invention, source and drain regions 32 may be formed, interlevel dielectric 34 deposited and electrical contacts (not shown) completed, as is conventional.

The present invention provides a process for lithography, implant and etching which supports the creation of gate electrodes having smooth sidewalls. The gate layer is amorphized where it is not covered by the gate electrode mask. Because of lateral diffusion, the amorphized area extends partly under the gate mask. Thus, the amorphized polysilicon is etched resulting in smooth sidewalls. However, most of the gate comprises non-amorphized polysilicon which does not suffer depletion effects.

While the invention has been particularly shown and described with reference to the preferred embodiments thereof, it will be understood by those skilled in the art that various changes in form and details may be made without departing from the spirit and scope of the invention.

What is claimed is:

1. A method of forming a smooth edged polysilicon gate in an integrated circuit device comprising:

providing a gate oxide layer over the surface of a semiconductor substrate;

depositing a polysilicon layer overlying said gate oxide layer;

depositing a masking layer over said polysilicon layer;

patterning said masking layer to leave a mask overlying a region where said gate is formed;

ion implanting said polysilicon layer in portions not covered by said mask thereby amorphizing said polysilicon layer not covered by said mask and amorphizing a portion of said polysilicon layer covered by said mask by lateral diffusion of said ions; and etching away said polysilicon layer not covered by said mask to form said polysilicon gate having a smooth region of said amorphized polysilicon layer along edges of said polysilicon gate to complete formation of said smooth edged polysilicon gate completing fabrication of said integrated circuit device.

2. The method according to claim 1 wherein said polysilicon layer is deposited to a thickness of between about 800 to 5000 Angstroms.

3. The method according to claim 2 wherein said polysilicon layer comprises polysilicon germanium.

4. The method according to claim 1 wherein said ions implanted into said polysilicon layer are silicon with a dosage of between about 8E14 to 5E15 atoms/$cm^2$ and energy varied between about 30 to 120 keV wherein said energy level is adjusted so that the projected depth covers the entire thickness of said polysilicon layer.

5. The method according to claim 1 wherein said ions implanted into said polysilicon layer are germanium with a dosage of between about 5E14 to 5E15 atoms/$cm^2$ and energy varied between about 50 to 270 keV wherein said energy level is adjusted so that the projected depth covers the entire thickness of said polysilicon layer.

6. The method according to claim 1 wherein said ions implanted into said polysilicon layer comprise one of the group containing silicon, germanium, phosphorous, boron and $BF_2$ with a dosage of between about 5E14 to 5E15 atoms/$cm^2$ and energy varied between about 30 to 270 keV wherein said energy level is adjusted so that the projected depth covers the entire thickness of said polysilicon layer.

7. The method according to claim 1 wherein said step of etching of said polysilicon layer is performed with an endpoint detection followed by an overetch of between about 10 to 150%.

8. The method according to claim 1 wherein said gate oxide layer is composed of silicon oxide deposited by dry or partial wet oxidation with a $NH_4/N_2O$ anneal at a temperature of between about 700 to 900° C. to a thickness of between about 10 to 150 Angstroms.

9. The method according to claim 1 wherein said gate oxide layer is composed of silicon oxide deposited or grown by RTO at a temperature of between about 400 to 1000° C. to a thickness of between about 10 to 150 Angstroms.

10. A method of forming a smooth edged polysilicon gate in an integrated circuit device comprising:

providing a gate oxide layer over the surface of a semiconductor substrate;

depositing a polysilicon layer overlying said gate oxide layer;

depositing a masking layer over said polysilicon layer;

patterning said masking layer to leave a mask overlying a region where said gate is formed;

ion implanting said polysilicon layer in at least two steps with increasing energy levels in portions not covered by said mask thereby amorphizing said polysilicon layer not covered by said mask and amorphizing a portion of said polysilicon layer covered by said mask by lateral diffusion of said ions; and etching away said polysilicon layer not covered by said mask to form said polysilicon gate having a smooth region of said amorphized polysilicon layer along the edges of said polysilicon gate to complete formation of said smooth edged polysilicon gate in the fabrication of said integrated circuit device.

11. The method according to claim 10 wherein said polysilicon layer is deposited to a thickness of between about 800 to 5000 Angstroms.

12. The method according to claim 11 wherein said polysilicon layer comprises polysilicon germanium.

13. The method according to claim 10 wherein said ions implanted into said polysilicon layer are silicon with a dosage of between about 8E14 to 5E15 atoms/cm$^2$ and energy varied between about 30 to 120 keV wherein said energy level is adjusted so that the projected depth covers the entire thickness of the polysilicon layer.

14. The method according to claim 10 wherein said ions implanted into said polysilicon layer are germanium with a dosage of between about 5E14 to 5E15 atoms/cm$^2$ and energy varied between about 50 to 270 keV wherein said energy level is adjusted so that the projected depth covers the entire thickness of the polysilicon layer.

15. The method according to claim 10 wherein said ions implanted into said polysilicon layer comprise one of the group containing silicon, germanium, phosphorous, boron and BF$_2$ with a dosage of between about 5E14 to 5E15 atoms/cm$^2$ and energy varied between about 30 to 270 keV wherein said energy level is adjusted so that the projected depth covers the entire thickness of the polysilicon layer.

16. The method according to claim 10 wherein said step of etching of said polysilicon layer is performed with an endpoint detection followed by an overetch of between about 10 to 150%.

17. A method of forming a smooth edged polysilicon gate in an integrated circuit device comprising:

providing a gate oxide layer over the surface of a semiconductor substrate;

depositing a polysilicon layer overlying said gate oxide layer;

depositing a masking layer over said polysilicon layer;

patterning said masking layer to leave a mask overlying a region where said gate is formed;

ion implanting said polysilicon layer in portions not covered by said mask wherein said ions are implanted at a first energy level of between about 30 to 50 keV, a second energy level of between about 60 to 80 keV, and a third energy level of between about 90 to 120 keV, thereby amorphizing said polysilicon layer not covered by said mask and amorphizing a portion of said polysilicon layer covered by said mask by lateral diffusion of said ions; and etching away said polysilicon layer not covered by said mask to form said polysilicon gate having a smooth region of said amorphized polysilicon layer along the edges of said polysilicon gate to complete formation of said smooth edged polysilicon gate in the fabrication of said integrated circuit device.

18. The method according to claim 17 wherein said polysilicon layer is deposited to a thickness of between about 800 to 5000 Angstroms.

19. The method according to claim 18 wherein said polysilicon layer comprises polysilicon germanium.

20. The method according to claim 17 wherein said ions implanted into said polysilicon layer are silicon at a dosage of between about 8E14 to 5E15 atoms/cm$^2$.

21. The method according to claim 17 wherein said ions implanted into said polysilicon layer are germanium at a dosage of between about 5E14 to 5E15 atoms/cm$^2$.

22. The method according to claim 17 wherein said ions implanted into said polysilicon layer comprise one of the group containing silicon, germanium, phosphorous, boron and BF$_2$.

23. The method according to claim 17 wherein said step of etching of said polysilicon layer is performed with an endpoint detection followed by an overetch of between about 10 to 150%.

* * * * *